United States Patent [19]

Hoge

[11] 4,143,348

[45] Mar. 6, 1979

[54] AIR TEMPERATURE SENSOR CONNECTION ASSEMBLY

[75] Inventor: Robert R. Hoge, Birmingham, Mich.

[73] Assignee: The Bendix Corporation, Southfield, Mich.

[21] Appl. No.: 857,560

[22] Filed: Dec. 5, 1977

[51] Int. Cl.² ............................................. H01C 7/02
[52] U.S. Cl. .................................. 338/28; 338/22 SD
[58] Field of Search .................. 338/22 R, 22 SD, 25, 338/28, 30; 73/362 AR, 27 R; 357/28

[56] References Cited

U.S. PATENT DOCUMENTS

| 3,586,486 | 6/1971 | Hokim | 73/27 R X |
| 3,918,018 | 11/1975 | Tuley et al. | 338/28 |
| 4,065,760 | 12/1977 | Feldon | 338/28 |

Primary Examiner—C. L. Albritton
Attorney, Agent, or Firm—Gaylord P. Haas, Jr.; Russel C. Wells

[57] ABSTRACT

A fast response fluid temperature sensor is disclosed which consists of a silicon temperature sensing semiconductor chip mounted on an extremely thin fin having a high surface area to mass ratio. The fin and chip combination are mounted in a frame assembly, with the thermal conductivity of the frame assembly being high and the specific heat being low for maximum heat transfer from the fluid being sensed to the silicon chip. The chip and fin assembly are illustrated as being open to the free flow of fluid around the assembly, no insulating material being provided between the fluid media being sensed and the fin and chip assembly, and a protective cage is formed around the fin and chip assembly. Suitable connection is made between one electrical terminal of the chip and the fin and between the other electrical terminal of the chip and the external circuitry, with various modified forms of such connections being illustrated.

5 Claims, 18 Drawing Figures

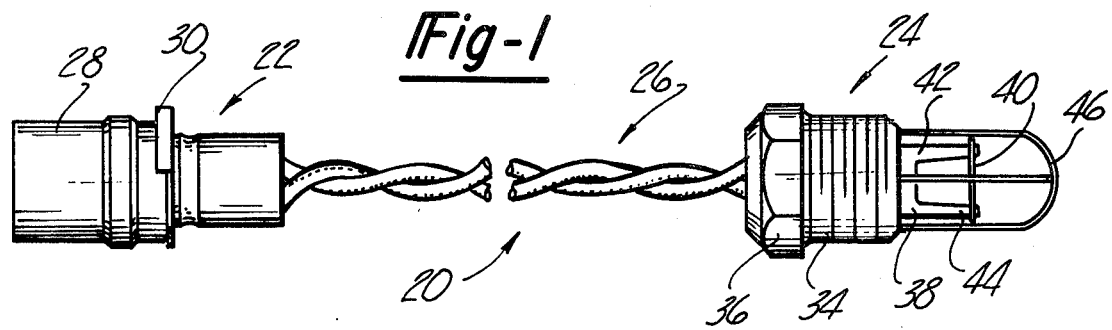
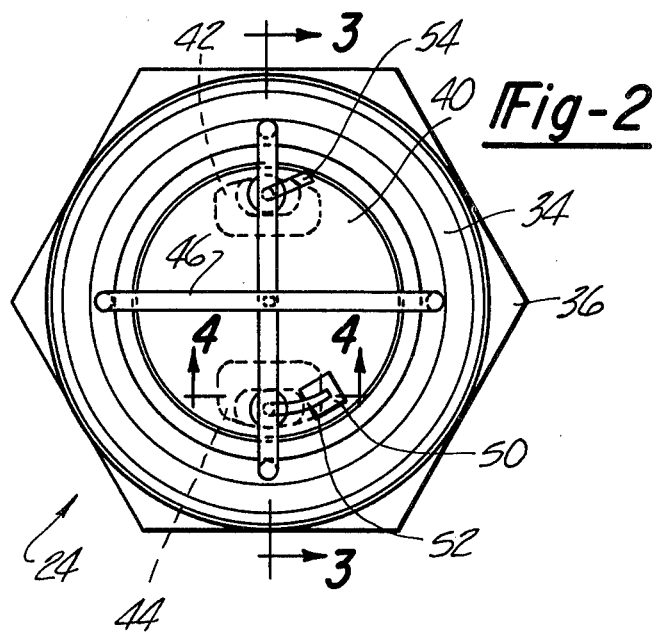
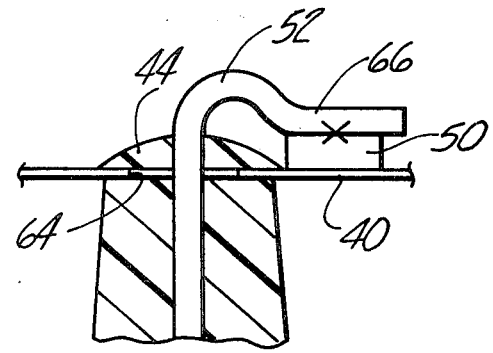
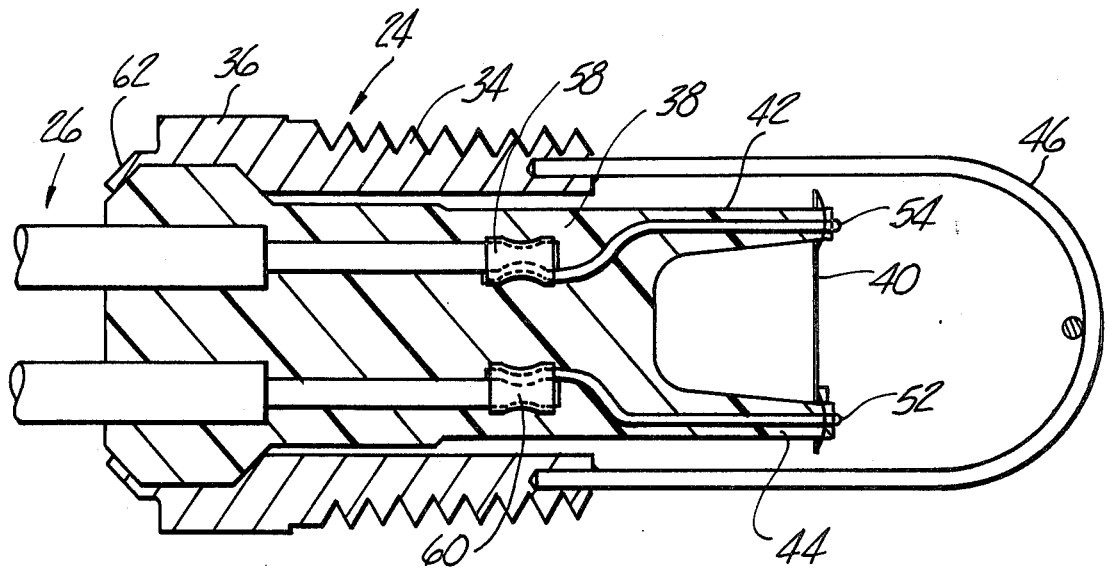

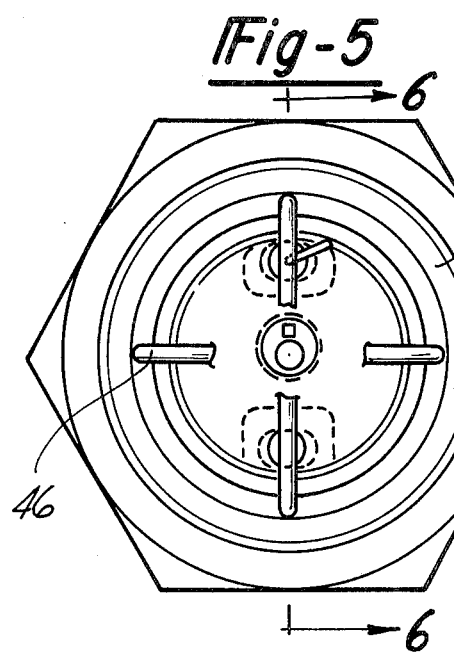
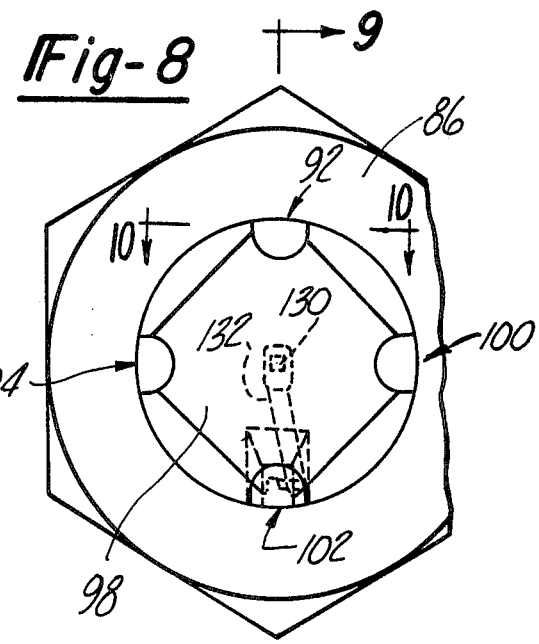
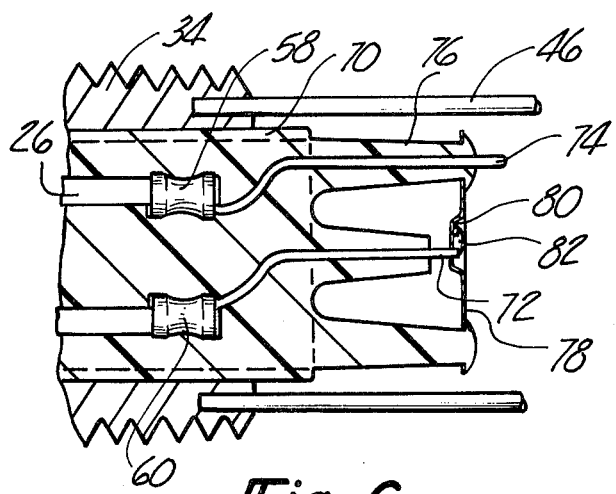
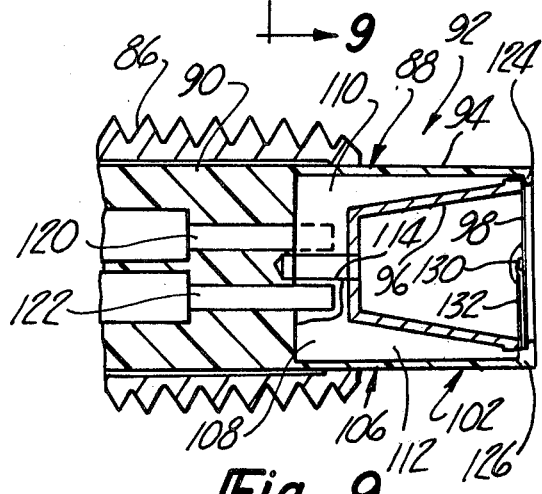
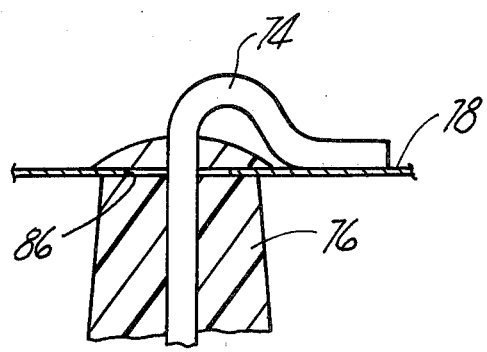
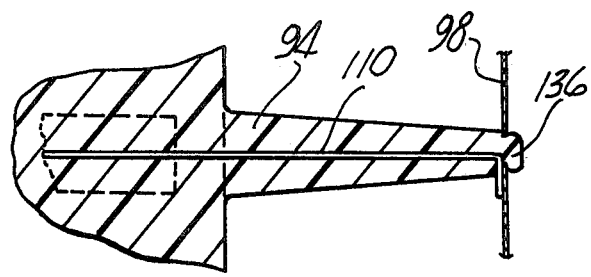

AIR TEMPERATURE SENSOR CONNECTION ASSEMBLY

BACKGROUND OF THE INVENTION

1. Field of the Invention

This invention relates generally to a fluid temperature sensor and more specifically to a fluid temperature sensor of the semiconductor type having a high surface area to mass ratio for the temperature sensing assembly thereby providing an extremely fast acting temperature sensing unit. This invention is a modification of inventions disclosed in copending application Ser. Nos. 857,558 and 857,559, filed Dec. 5, 1977 and commonly assigned.

2. Description of the Prior Art

As described above, the present invention relates to a temperature sensor which will provide a fast response device suitable for use in control systems where a rapid temperature sensing of a flowing fluid media is required. A typical use of such a temperature sensor would be in conjunction with the air induction system in an automotive engine wherein the air temperature is utilized in conjunction with other engine parameters for controlling the fuel in a fuel management system.

There are devices presently on the market which are similar to that which is to be described, but do not provide the extremely fast temperature response associated with the sensor of the present invention. In the temperature sensors presently being manufactured, for example by the Texas Instruments Corporation, the temperature sensing element is a silicon chip semiconductor which is doped by various impurities to control the resistance of the chip in response to variations in temperature. The silicon semiconductor chips are sized as blocks of approximately 0.015 × 0.015 × 0.006 inch dimension, the blocks being bonded to a metal plate on one side and a gold wire attached to the opposite side of the chip in typical semiconductor manufacturing fashion. The chip is then bonded to a metallic frame which is used as the base of the device, which frame is approximately 500 times the mass of the silicon chip. The entire assembly is then encased in a plastic molding for handling and installation strength.

The metallic frame utilized as the base of the device is of a thick cross-sectional area and relatively short in length thereby providing a low surface area to mass ratio. Further, the plastic incapsulant which has been made a structural part of the device has a low thermal conductivity compared to metal and thus impedes the flow of heat to or from the silicon chip. This incapsulant has been utilized due to the structural design of the assembly.

SUMMARY OF THE INVENTION

It has been found that the dynamic performance of a semiconductor type temperature sensor can be maximized if the mass of the semiconductor chip utilized in conjunction with sensors of this type is minimized and is bonded to a metallic fin having a large area relative to the mass of the fin and semiconductor chip assembly. In a preferred embodiment, the connection to one terminal of the semiconductor chip is achieved by conductively bonding the chip to the metallic fin and providing a second lead to the edge of the fin by various techniques to be described in conjunction with the description of FIGS. 12-17.

The metallic fin should be arranged so that the fluid flow of the fluid being sensed is parallel to the fin or in maximum heat transfer therewith. As will be shown, the temperature response of a thin, constant thickness metallic fin emersed in a fluid is primarily a function of the surface area to mass ratio of the fin. Thus, for a given material and independent of the size of the fin, the temperature response time constant approaches zero as the thickness of the fin approaches zero in a theoretical assembly.

For a practical assembly, the density and specific heat also affect the time constant and both parameters have been found to minimize the response time when these parameters are minimized. Additionally, when the silicon chip is added to the fin, the heat transfer between the fin and silicon chip becomes important. The thermal contact material between the fin and chip must be of a high conductivity type, as for example gold. Additionally, the heat flow from the surrounding areas of the fin relative to the area covered by the semiconductor chip must be maximized. Accordingly, the thermal conductivity of the fin becomes important and any material with high heat conductivity (such as aluminum) is desirable.

In the preferred embodiment of the invention the fin is fabricated as a circular, thin metallic disc with a semiconductor chip mounted centrally of the edges of the disc. Theoretically, the fin should be fabricated of a tapering cross-section, the thickest portion of the cross-section being in the area wherein the semiconductor chip is mounted, the fin tapering to zero thickness at the periphery. In the practical embodiment of the invention, the fin is supported at the periphery by various means and the semiconductor chip is electrically bonded on the surface of the chip but not in contact therewith.

It has been found that the assembly which supports the fin must be such that heat flow to or from the support is minimized since this heat does not necessarily result from the temperature of the fluid under consideration and, therefore, the dynamic performance and the steady state temperature of the semiconductor chip maybe affected. Stated otherwise, a difference in temperature between the chip and the fluid media represents an error in the output signal and it is this error which should be minimized for any given instantaneous period of time. It is the desiratum of this invention to minimize the transient time to achieve stability between the temperature of the chip and the temperature of the fluid under consideration.

As stated above, one possible source of error in this signal results from heat flow to or from the fin support. Therefore, the fin support should be located at a point as remote as possible from the semiconductor chip and in the preferred embodiment this support is established at the outer edge of the chip. Therefore, this necessity for a mechanical attachment prevents the outer edge of the chip from being a theoretical ideal zero thickness. It has been found that if the fin is of sufficient size in area, the radial flow of heat from the inner to outer or outer to inner portion of the chip is essentially zero, and thus the heat flow due to the mechanical support of the fin is minimized.

In a preferred embodiment of the invention, the other terminal, other than the fin terminal, connected to the chip is formed by providing a thin stripe of insulating material from the outer edge of the fin radially inwardly to the semiconductor chip, up the side of the semiconductor chip and slightly overlapping the top surface thereof. The lead wire, ribbon or conducting film is then fabricated to conform to the surface of the insulating stripe and extended on the top surface of the chip beyond the insulating stripe. Finally, a second thin coat of insulating material is applied to the lead to encase the lead from its end adjacent the bare upper surface of the semiconductor chip across the fin to the outer edge of the fin.

The insulating material may be any plastic adhesive which satisfies the adhesive requirements of the fin and has an electrical resistance when in place for at least two orders of magnitude greater than the resistance of the semiconductor chip and is tolerant of the temperature and the environmental conditions of the finished temperature sensor. A typical material for automotive applications is the cyanoacrylate class of adhesives such as marketed by the Eastman Corporation as adhesive 910THT.

Since the lead wire and adhesive material described above represent additional undesirable mass, the adhesive insulating stripe should be of minimal thickness and the wire should be of minimal size to minimize the effect of this additional mass on the dynamic and steady state performance of the sensor assembly.

In selecting suitable fin material the following relationship is considered to be of significance in investigating the various characteristics of a material for its merit in conjunction with use in connection with the present invention. For maximum theoretical performance, the following relationship exists.

$$M_f = [K/(\rho) (Sp.Hp.)]$$

where
  $K$ = thermal conductivity,
  $\rho$ = density, and
  $SP.HP.$ = specific heat The most desirable material is that which has properties maximizing the term $M_f$. In a practical application, other properties such as cost fabricability, environmental tolerance and availability may modify the material selection. In a modified form of the invention it has been found that the heat transfer from the fin to the chip maybe maximized and the apparent mass of the assembly minimized by contacting both sides of the chip with an individual fin. Thus, each fin becomes one of the electrical connections to the chip and the transfer of heat to and from the fin, and thus the semiconductor chip, is made most efficient. It is apparent that the fin must be spaced a sufficient distance to prevent interference of the flow of the fluid under consideration between the fins, which interference would lower the heat transfer between the fins and the fluid. As a modified form of the invention, it has been found that the fins could be fabricated of approximately a conical or disc shape with the apex of each disc electrically connected to the opposite sides of the semiconductor chip. With both fins attached to a support structure, as particularly illustrated in FIG. 11, a very stiff mechanical structure is obtainable.

Electrical connection to the fin or plural fins maybe accomplished by providing electrically conducting supports for the fin or for the conductors in nonconducting supports. The attachment of the leads to the outer peripher maybe made by any suitable method such as soldering, welding, conductive adhesives, or by simple mechanical contact. An alternate lead and support approach may be to provide integral support arms on the basic fin stamping which maybe bent to suitable shape to provide support and convenient electrical connection to the temperature sensing body.

As is readily apparent, the fin or plurality of fins maybe formed by die stamping methods and suitable radial or circumferntial ridges maybe provided in the fins to enhance structural ridigity. These fins may additionally perform the function of promoting boundary layer turbulence for better heat transfer between the fluid under consideration and the fin and may also be utilized to provide a protective trough for lead wires and insulation.

Accordingly, it is one object of the present invention to provide an improved fluid temperature sensing device.

It is another object of the present invention to provide improved temperature sensing device for a fluid having extremely fast dynamic and steady state performance.

It is a further object of the present invention to provide an improved fluid temperature sensing device having a high surface area to mass ratio to enhance the transfer of heat from a heat transfer device to the actual temperature sensing element.

It is another object of the present invention to provide an improved fluid temperature sensing device which responds faster than previous known temperature sensing devices by an order of magnitude.

It is still another object of the present invention to provide an improved mounting assembly for a temperature sensing device which enhances the response time and steady state performance of the temperature sensor assembly.

It is a further object of the present invention to provide improved lead connection techniques for temperature sensing assemblies incorporating assembly conductor chips for the sensing element.

It is still another object of the present invention to provide an improved temperature sensing assembly utilizing a semiconductor chip which enhances the transfer of heat from the fluid whose temperature is being considered to the semiconductor chip.

It is another object of the present invention to provide an improved fluid temperature sensing assembly which is inexpensive to manufacture, reliable in operation and easily installed.

Further objects, features and advantages of the present invention will become more readily apparent upon a consideration of the following specification when taken in conjunction with the attached drawings, in which:

BRIEF DESCRIPTION OF THE DRAWINGS

FIG. 1 is a side view of a preferred form of the fast response air temperature sensor incorporating certain features of the present invention;

FIG. 2 is a top view of the air temperature sensor of FIG. 1 and particularly illustrating the positioning of the semiconductor chip and the interconnections between the output leads and the semiconductor chip and fin;

FIG. 3 is a cross-sectional view of the air temperature sensor of FIG. 2 taken along line 3—3 thereof;

FIG. 4 is a cross-sectional view of the interconnection between the output conductor and the semiconductor chip of FIG. 2 taken along line 4—4 thereof;

FIG. 5 is a top view of a modified form of the fast response temperature sensor of FIG. 1;

FIG. 6 is a partial cross-sectional view of the modified air temperature sensor of FIG. 5 taken along line 6—6 thereof and particularly illustrating a modified position for the semiconductor chip and the interconnection with the output conductor;

FIG. 7 is a cross-sectional view similar to FIG. 4 and particularly illustrating the interconnection between the output conductor and the fin, the cross-sectional view taken along line 7—7 of FIG. 5;

FIG. 8 is a top view of another modified form of the fast response air temperature sensor of the present invention, partially broken away;

FIG. 9 is a cross-sectional view of the modified air temperature sensor of FIG. 8 taken along line 9—9 thereof;

FIG. 10 is another cross-sectional view of the modified air temperature sensor of FIG. 8 taken along line 10—10 thereof;

DETAILED DESCRIPTION OF THE INVENTION

Figure 11:
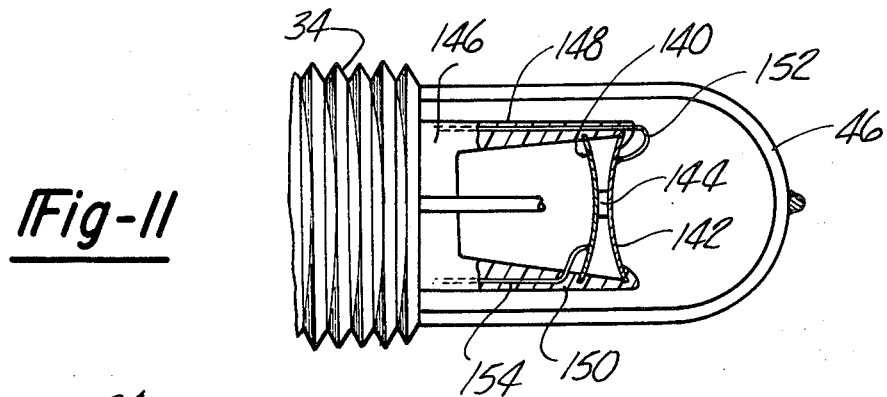
FIG. 11 is a further modified air temperature sensor utilizing certain other features of the present invention, this figure being shown partially in section to illustrate the interconnection between the dual fins and the support members.

Referring now to the drawings, and particularly FIG. 1 thereof, there is illustrated a side view of a preferred form of temperature sensor 20 incorporating the features of the present invention. The sensor 20 includes three portions, a connector 22, the sensor assembly 24 and a pair of interconnecting wires 26 which provide a connection between the sensor 24 and the connector 22. The connector 22 is of the type typically utilized in the automotive industry which includes a housing 28, within which are formed the plug and socket members utilized to mate with the corresponding socket and plug members, respectively, in the wiring harness of the automobile. Suitable interlocking means 30 is provided to lock the housing 28 to the corresponding member in the wiring harness to preclude the two members from being unintentionally disassembled.

The temperature sensor assembly includes a brass or other suitable metal fitting 34 which is adapted to be threaded into an aperture in the intake manifold of an automobile and suitably tightened by means of a hexagonal head portion 36 as is common in the automotive art. The temperature sensor assembly 24 further includes a molded element 38 which is adapted to mount a fin 40 at one end thereof and rigidly fix the fin 40 relative to the brass fitting 34 as we will fully explain hereinafter. The conductors 26 are molded within the interior of the plastic element 38 and, as will be seen hereinafter, the conductors are led up through the center of a pair of mounting arms 42, 44. The entire assembly including arms 42, 44 and the fin 40 are protected by a wire cage 46 which include a pair of formed domed wires which are welded at their apex and the opposite ends thereof are inserted into apertures formed in the brass fitting 34 and soldered into place. Thus, the temperature sensing fin 40, and the semiconductor chip to be described hereinafter, are protected from foreign elements which may be injurious to the fin and semiconductor chip should these latter elements be struck by the foreign elements.

Referring now to FIG. 2, which is a top view of the temperature sensor assembly 24 of FIG. 1, there is illustrated the particular referred method of mounting the semiconductor chip on the fin 40 and also the method in which the connections are made to the conductors 26 from the fin 40 and a semiconductor chip 48. Specifically, the fin 40 has mounted thereon a nonconducting ceramic chip 50 by any suitable method described above, for example by conductive adhesive, etc. As is seen from FIG. 2, the chip 50 is mounted a slight distance away from the mounting arm 44 to permit a conductor 52 centered in the mounting arm 44 to be led up through an aperture formed in the fin 40. The conductor 52 is then lapped over the top of the fin 40 and attached to the nonconducting chip 50 as will be more fully explained in conjunction with the description of FIG. 4 a conductor 53, in the form of a gold wire, connects the conductor 52 with the semiconductor chip 48. Similarly, a conductor 54 which is molded into the center of mounting arm 42 is led up through a second aperture formed in the fin 40 and folded over into engagement with the top surface of the fin 40. The conductor 54 is then suitably attached to fin 40 by soldering or conductive adhesives.

FIG. 3 illustrates various features of the assembly not illustrated in great detail in FIGS. 1 and 2. For example, the conductors 26 are molded withn the member 38 and suitable connectors 58, 60 are provided to connect the interconductors of conductors 26 to the conductors 52, 54. As is seen from FIG. 3, the conductors 54 are molded within the mounting arms 44, 42 respectively and folded over at the tops thereof to form the connections described in conjunction with FIG. 2. The material forming support elements 42, 44 is of the thermal plastic type whereby heat is applied to the upper ends of the members 42, 44 and the upper ends are melted over to form a firm attachment to the fin 40. As is seen from the left end of the drawing, the bottom of brass fastener 24 is swaged over at 62 to firmly hold the molded member 38 within the brass element 36.

Referring to FIG. 4, there is illustrated one method of interconnecting the conductor 52 with the semiconductor chip 48. Also illustrated is the heated portion of the upper end of mounting arm 44 which is melted to form the attachment between arm 44 and the fin 40.

As is seen from FIG. 4, the conductor 52 is led through an aperture 64 formed in the fin 40 and folded over to form a loop and a flat portion 66, flat portion 66 being contiguous with the upper surface of the chip 50. The portion 66 is then suitably attached to the nonconducting chip 50 by any suitable method, as for example, by using a conductive adhesive forming a mechanical bond and electrical contact between conductor 66 and chip 50. As will be seen from the description of FIGS. 12 to 17, other methods of attaching the conductors may be utilized or keeping within the spirit of the invention.

Referring now to FIG. 5, there is illustrated a modified form of the air temperature sensor of the present invention which includes substantially the same base element described above bearing reference numerals 34 and 36 and the same protective cage wires 46. The modified form as best illustrated in FIG. 6, includes a plastic element 70, into which is molded into the conductors 26, the connectors 58, 60 and a pair of conductors 72, 74. The conductors 74 is led up through a mounting arm 76 integrally formed as a part of the plastic member 70 and folded over for attachment to a fin element 78 as will be more fully described in conjunction with the description of FIG. 7.

As is seen from FIG. 6, the fin 78 is formed with a dished portion 80 into which is placed a semiconductor chip 82. The semiconductor chip 82 is suitably electrically connected to the conductor 72 by any suitable method as for example that describing in conjunction with FIG. 4 and to be described in conjunction with FIGS. 12-15. The dished portion 80 of the fin 78 provides protection for the chip 82 and enhances the uniform heating of the chip 82 by the fin member 78.

Referring to FIG. 7, it is seen that an aperture 86 is formed in the fin 78, through which is passed a thin upper portion of the mounting arm 76 and the conductor 74. The fin 76 is heated and melted to form a head to securely fasten the fin 78 to the mounting arm 76. The conductor 74 is folded over to be placed in close contact with the fin 78 and is considerably attached thereto, for example by soldering or through the use of adhesives.

Referring now to FIG. 8, there is illustrated another modified form of the assembly of the present invention. Particularly, a base element 86 is provided which maybe similar to that described in conjunction with the description of base element 24. Within the base element is mounted a plastic support member 88 which is modified with a base member 90 and a plurality of pairs of arms 92 including an outer arm 94 and an inner arm 96. As is best seen in FIG. 8, the pairs of support arms 94, 96 are adapted to rigidly support a generally square fin element 98, there being four pairs of arms 92, 100, 102 and 104.

As is best seen in FIGS. 9 and 10, there is molded between the inner and outer arms of each pair of arms 92, 102 a generally U-shaped conductive element 106, the conductive element being formed with a cross member 108 and a pair of arms 110, 112. It will be noted from FIG. 9 that the arms 110, 112 are generally tapered from the cross member 108 to the outer end of the arms 110, 112. It is to be noted that the U-shaped member 106 is only provided between pairs of support arms 92 and 102. Prior to attaching the disc 98, an aperture 114 is drilled into the assembly to separate the arm or the conductive member 112 from the conductive member 110 for purpose to be seen from a further explanation of the assembly.

The molded base member 90 has embedded therein a pair of conductors 120, 122 which are electrically connected to the conductive arms 110, 112 respectively by any suitable means, as for example by soldering. After assembly of the disc 98 into place, the ends 124, 126 are heated and folded over to form a rigid attachment of the disc 98 between the arms 94, 96, the pair of arms 102 is illustrated in FIG. 9, and also between the pairs of arms 100 and pairs of arms 104 as seen in FIG. 8. As best seen in FIGS. 8 and 9, the disc 98 is provided with a centrally located semiconductor chip 130 mounted on the bottom thereof, with a suitable conductor 132 interconnecting the semiconductor chip 130 with the conductive element 112. This connection to the semiconductor chip 130 could be by any suitable means as for example that illustrated in FIG. 4, 12, 13, 14, and 15. Of course, suitable insulating material must be provided between the conductor 132 and the disc 98 to ensure that the conductor 132 is insulated from the disc 98. The disc 98 is caused to overlap the upper end of the conductive arm 110 to ensure an electrical connection to the conductive arm 110. Thus, the electrical circuit illustrated in FIG. 9 is from conductor 120, through conductor 110, through disc 98, chip 130, conductor 132, conductor 112, to conductor 122.

FIG. 10 illustrates a method of connecting the disc 98 to the conductive member 110 whereby the conductive member 110 is provided with a 90-degree bend at the end thereof to be placed in electrical contact with the disc 98. As described above, the upper end of arm 94 is heated and folded over at end 136 to ensure a tight connection between the conductive member 110 and the disc 98.

Referring now to FIG. 11, it is illustrated a further modification of the fast response air temperature sensor of the present invention. In this modified version, a pair of fins 140, 142 are provided, the fins 140, 142 being generally dished shaped with the apex of each dish facing the other apex of the other dish. Sandwiched between the two fins 140, 142 is a semiconductor chip 144 similar to that described in conjunction with the previous figures. As was the case previously, the discs 140, 142 are suitably fastened to a thermal plastic member 146, the thermal plastic member 146 having a pair of arms 148, 150 into which are molded a pair of conductors 152, 154. As is seen from FIG. 11, the conductor 152 is folded over and suitably soldered to the upper face of fin 142 and conductor 154 exits from the support arm 150 short of the end thereof and is directed toward the fin 140 and suitably soldered thereto. The upper ends of arms 148, 150 are heated and folded over to provide a rigid attachment for the upper fin 142. While only two arms 148, 150 have been shown, it is to be understood that molded element 146 maybe provided with four arms of an identical configuration two arms 148, 150 with the exception that no conductors will be molded within two of the arms. As was described in the early part of the specification, the configuration of FIG. 11 provides a simple method of electrically connecting fins 140, 142 to the semiconductor chip 144. Also, the configuration of FIG. 11 does not require the delicate attachment of a conductive lead to the semiconductor chip as was previously described.

Figure 12:
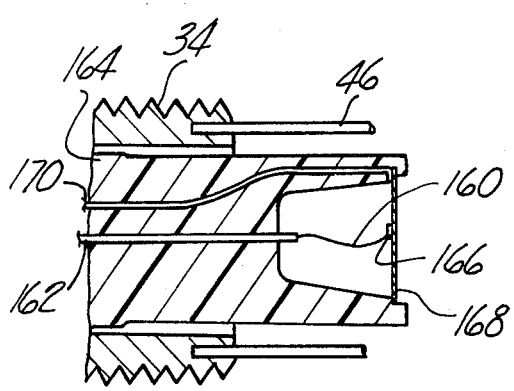
FIG. 12 is a cross-sectional view of a further modification of the air temperature sensor of the present invention and particularly illustrating another type of interconnection between the output conductors and the fin and semiconductor chip.

FIGS. 12-15 illustrate various other methods of attaching leads to the semiconductor chip, particularly FIG. 12 illustrates the attachment of a fine gold wire 160 from a conductor 162 molded in a support member 164, the wire being attached at the other end thereof to a semiconductor chip 166. The chip 166 is attached to a fin member 168 as was described above. The electrical connection between the fin 168 and a second conductor 170 is provided by folding over the end of conductor 170 and positioning it in face-to-face relation with the fin 168.

Figure 13:
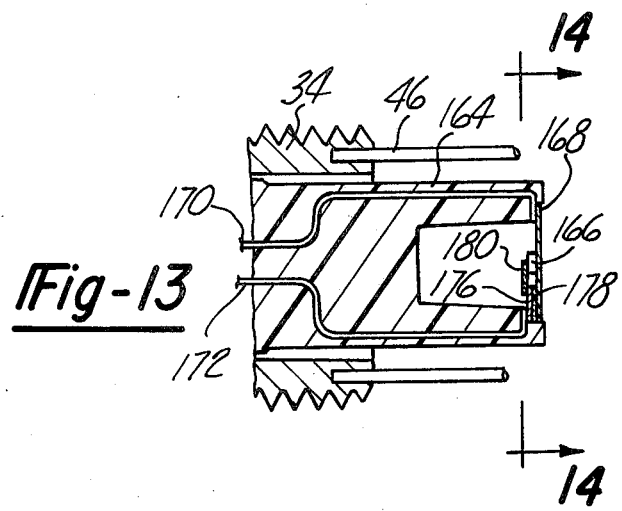
FIG. 13 is a cross-sectional view of another modified form of the present invention and particularly illustrating a modification of the interconnections between the output conductors and the fin and semiconductor chip.
Figure 14:
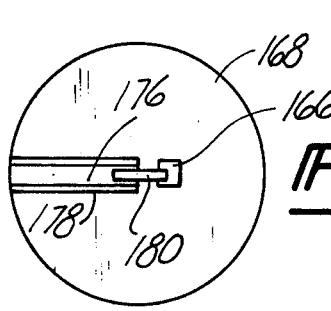
FIG. 14 is a bottom view of the semiconductor chip, thin and interconnection assembly of FIG. 13 taken along line 14—14 thereof.

FIG. 13 is a similar configuration to that described in conjunction with FIG. 12 with respect to the mounting of the fin 168 and its interconnection with the conductor 170. However, a conductor 172 is provided which is molded into the other arm of support element 164 and folded over at the end thereof to provide an open face for electrical attachment to another conductor. Again, the chip 166 is provided but is connected to the conductor 172 through a conductor 176. The conductor 176 is insulated from the fin 168 by means of insulating material 178 sandwiched between the fin 168 and the conductor 176. A bridge is provided between the conductor 176 and the chip 166 by means of a flap conductor 180 as is best illustrated in FIG. 14.

Figure 15:
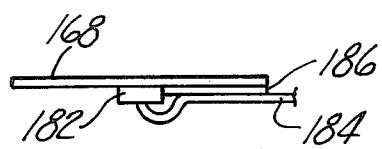
FIG. 15 is an illustration of a further modification of a method for providing connections from the output conductor to the semiconductor chip.

FIG. 15 illustrates a rather simple connection between a chip 182 and a conductor 184. Taking for example an attachment to the disc 168, a suitable layer of insulating material 186 is provided and the conductor 184 is attached to the insulating material 186. The conductor 186 could be the conductor illustrated as conductor 172 in FIG. 13. The insulating material 186 could be built up to the level of the lower face of chip 182 and the conductor 184 would merely pass across the insulating material 186 and the chip 182 in a straight line rather than the loop illustrated in FIG. 15.

Figure 16:
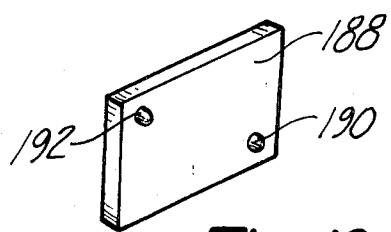
FIG. 16 is a perspective view of a modified form of semiconductor chip in which the output terminals for the semiconductor chip are provided on a single face thereof.
Figure 17:
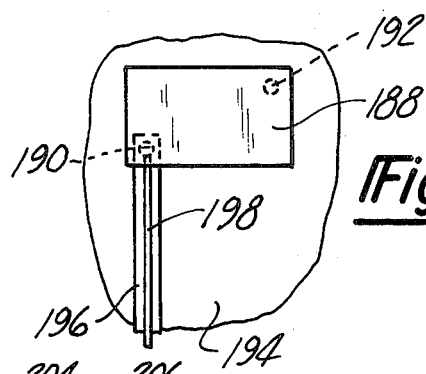
FIG. 17 is a plan view, partially broken away, of a method of mounting the semiconductor chip of FIG. 16 on a fin and particularly illustrating the connections between the semiconductor chip and the fin and output conductor.

FIGS. 16 and 17 illustrate a modified form of semiconductor chip wherein the chip is provided with both output terminals on a single face thereof. For example, a chip 188 may have a pair of terminal projections 190, 192 formed thereon, which projections are utilized to form the terminals for connection to the disc and external conductor associated with the chip. FIG. 17 illustrates this particular connection wherein a disc 194 is provided with a strip of insulating material 196 and a conductor 198. The chip 188 is then positioned as shown wherein the projection 192 is an electrical contact with the fin 194 and the projection 190 is in contact with the strip conductor 198. The strip conductor can then be connected to the chip associated support arms illustrated in FIGS. 3, 9 or 11.

Figure 18:
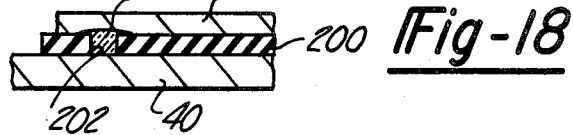
FIG. 18 is a modified form of the invention wherein the temperature responsive element is attached by thick or thin film techniques.

FIG. 18 illustrates the invention as applied by thick film techniques. While thick film application is described, it is to be understood that thin film techniques apply equally as well. Referring to the drawing, the fin 40 forms the substrate on which the various layers are deposited by the screening process. In carrying out the process, an insulating strip 200 is deposited on the fin 40 with an aperture 202 formed in the strip 200 by either blocking the area of the aperture 202 with an emulsion or by etching the area of the aperture from the strip 200. A semiconductor portion 204 is then deposited in the aperture 202 in contact with the fin 40. Finally a strip conductor 206 is deposited on the portion 204 and on strip 200, and within the confines thereof, to form the conductive strip corresponding to strip 198 in FIG. 17, or conductor 53 in FIG. 2. In the thin film counterpart, the various layers are sputtered or evaporated with the necessary masking or etching to form the desired shapes.

A preferred form of the above described temperature sensor included a brass disc having a thickness of between 3 and 4 mils and a diameter of approximately 7/16 inch, and the response time of the sensor is approximately one second for one hundred degrees change in temperature. The above dimensions provide a fin which is sufficiently stiff while maintaining the high surface area to mass ratio required to give the desired fast response time.

Having described a preferred embodiment of the invention and several modifications thereof, it will be understood that the examples given are employed in a descriptive sense only and not for purposes of limitation. Other embodiments and variations will be obvious to those skilled in the art and be made without departing from the spirit and scope of my invention which is limited only by the appended claims.

I claim:

1. A temperature sensor for sensing the temperature of a fluid comprising a base member having at least first and second support arms thereon, fin means formed of a thin disc having a high surface area to mass ratio fixingly mounted on said first and second support arms whereby said fluid to be sensed may flow over the top and bottom surface of said fin means, a semiconductor chip having the characteristic of changing resistance with changes in temperature mounted on said fin means, said semiconductor chip having a first and a second terminal on a single surface of said chip, one of said terminals being in electrical contact with said fin means, insulating means supported on said fin means between an edge of said fin means and said chip, conductive means mounted on said insulating means and within the confines thereof, the other of said terminals being in electrical contact with said conductive means, a first output conductor connected to said fin means, a second output conductor electrically insulated from said fin means and electrically connected to said conductive means.

2. The sensor of claim 1 wherein said first and second conductors are molded in said base member, said first conductor being molded in said first support arm and said second conductor being molded in said second support arm, said conductive means extending to the edge of said fin means.

3. The improvement of claim 2 further including a relatively open cage means fixingly mounted in surrounding relation with said fin means and said semiconductor chip.

4. The improvement of claim 3 wherein said cage means is formed of plural wires each having a generally U-shape, said wires being joined at the apex of said wires.

5. The improvement of claim 1 wherein said terminals are formed as projections from said single surface.

* * * * *